(12) United States Patent
Zhang et al.

(10) Patent No.: US 9,654,115 B2
(45) Date of Patent: May 16, 2017

(54) PHASE-LOCKED LOOP CIRCUIT, DATA RECOVERY CIRCUIT, AND CONTROL METHOD FOR PHASE-LOCKED LOOP CIRCUIT

(71) Applicant: Huawei Technologies Co., Ltd., Shenzhen (CN)

(72) Inventors: Bingzhao Zhang, Shanghai (CN); Yongwang Liu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/268,120

(22) Filed: Sep. 16, 2016

(65) Prior Publication Data

US 2017/0077933 A1    Mar. 16, 2017

(30) Foreign Application Priority Data

Sep. 16, 2015  (CN) .......................... 2015 1 0591719

(51) Int. Cl.
*H03L 7/06* (2006.01)
*H03L 7/08* (2006.01)
*H03L 7/089* (2006.01)
*H03L 7/093* (2006.01)
*H03L 7/099* (2006.01)
*H04L 7/033* (2006.01)

(52) U.S. Cl.
CPC .......... *H03L 7/0807* (2013.01); *H03L 7/0891* (2013.01); *H03L 7/093* (2013.01); *H03L 7/099* (2013.01); *H04L 7/0331* (2013.01)

(58) Field of Classification Search
USPC .................... 327/147–149, 156–158
See application file for complete search history.

(56) References Cited

U.S. PATENT DOCUMENTS

| 7,764,094 | B1* | 7/2010 | Arora ...................... | H03L 7/087 327/114 |
| 8,040,191 | B2* | 10/2011 | Hirai ...................... | H03L 7/0893 327/156 |
| 8,125,254 | B1* | 2/2012 | Ding ...................... | H03L 7/089 327/147 |
| 2011/0006820 | A1* | 1/2011 | Liu ...................... | H03L 7/093 327/157 |
| 2015/0004919 | A1* | 1/2015 | Ek .......................... | H03L 7/087 455/75 |

(Continued)

*Primary Examiner* — Adam Houston
(74) *Attorney, Agent, or Firm* — Conley Rose, P.C.

(57) ABSTRACT

A phase-locked loop circuit, which includes a phase frequency detector, a charge pump, a loop low-pass filter, a first voltage-current converter, a second voltage-current converter, a current-controlled oscillator, a frequency divider, a comparator, and a mode controller, where the mode controller is configured to control the switches S1, S2, and S3 included in the loop low-pass filter to connect or disconnect. Using the phase-locked loop circuit, a voltage value of a second control voltage signal VC2 provided for the first voltage-current converter can reach, in a relatively short time, a voltage value of a first control voltage signal VC1 provided for the second voltage-current converter, thereby increasing a speed of establishing the phase-locked loop circuit and implementing a quick response of the phase-locked loop circuit.

18 Claims, 7 Drawing Sheets

(56) References Cited

U.S. PATENT DOCUMENTS

| | | | |
|---|---|---|---|
| 2015/0145567 A1* | 5/2015 | Perrott | H03L 7/093 327/156 |
| 2015/0213873 A1* | 7/2015 | Joo | H03L 7/087 365/154 |
| 2015/0349786 A1* | 12/2015 | Erdogan | H03L 7/0807 375/375 |
| 2016/0164527 A1* | 6/2016 | Song | H03L 7/0814 327/158 |

* cited by examiner

PHASE-LOCKED LOOP CIRCUIT, DATA RECOVERY CIRCUIT, AND CONTROL METHOD FOR PHASE-LOCKED LOOP CIRCUIT

CROSS-REFERENCE TO RELATED APPLICATION

This application claims priority to Chinese patent application number 201510591719.1 filed on Sep. 16, 2015, which is incorporated by reference.

TECHNICAL FIELD

The present disclosure relates to a phase-locked loop circuit, and in particular, to a phase-locked loop circuit, a data recovery circuit, and a control method for a phase-locked loop circuit.

BACKGROUND

FIG. 1 is a schematic structural diagram of a dual-loop phase-locked loop circuit. The dual-loop phase-locked loop circuit includes a phase frequency detector, a charge pump, a loop low-pass filter, a first voltage-current conversion unit, a second voltage-current conversion unit, a current-controlled oscillator, and a frequency divider. The loop low-pass filter includes a first filter unit and a second filter unit, where a circuit that includes a resistor R1 and a capacitor C1 in the first filter unit has a relatively large time constant, and the time constant is far greater than a time constant of a circuit that includes a resistor R2 and a capacitor C2 in the second filter unit. Compared with the second voltage-current conversion unit, the first voltage-current conversion unit has a relatively large voltage-current conversion gain. The first voltage-current conversion unit and the first filter unit form a coarse adjustment circuit, which is configured to coarsely adjust a frequency of a phase-locked loop output signal to approach a target frequency. The second voltage-current conversion unit and the second filter unit form a fine adjustment circuit, which is configured to finely adjust a frequency of a phase-locked loop output signal to a target frequency. The current-controlled oscillator is configured to generate a phase-locked loop output signal whose frequency is a target frequency. The frequency divider is configured to divide a frequency of a phase-locked loop output signal. The time constant of the circuit that includes the resistor R1 and the capacitor C1 in the first filter unit is relatively large, which results in a long locking time for the dual-loop phase-locked loop circuit and a low response speed.

SUMMARY

Embodiments of the present disclosure provide a phase-locked loop circuit, which can increase a speed of establishing the phase-locked loop circuit and implement a quick response of the phase-locked loop circuit.

According to a first aspect, the present disclosure provides a phase-locked loop circuit, where the phase-locked loop circuit includes a phase frequency detector configured to receive a reference source signal and a feedback signal that is output by a frequency divider, and generate a first error signal, a charge pump coupled to the phase frequency detector and configured to generate a first voltage signal according to the first error signal that is output by the phase frequency detector, a loop low-pass filter, including a first filter unit, a second filter unit, a third node, and a fourth node, where the first filter unit is configured to filter out a high frequency component in the first voltage signal that is output by the charge pump and generate a first control voltage signal VC1 to provide for a second voltage-current conversion unit. The second filter unit is configured to filter out a high frequency component in the first voltage signal that is output by the charge pump and generate a second control voltage signal VC2 to provide for a first voltage-current conversion unit. The first filter unit includes a first resistor R1 and a first capacitor C1, where the R1 and the C1 are connected in series. The second filter unit includes a second resistor R2 and a second capacitor C2, where the R2 and the C2 are connected in series. The third node is a node for taking out the first control voltage signal VC1, and the fourth node is a node for taking out the second control voltage signal VC2, where the loop low-pass filter further includes a switch S1, a switch S2, and a switch S3, where one end of the S1 is coupled to a first node between the R1 and the C1, and the other end is coupled to a second node between the R2 and the C2, two ends of the S2 are respectively coupled to the first node and the fourth node, and two ends of the S3 are respectively coupled to the third node and the fourth node. The phase-locked loop circuit further includes a mode controller, coupled to the loop low-pass filter, and configured to control the S1 to alternatively connect and disconnect, the S2 to connect, and the S3 to disconnect in the loop low-pass filter when a bandwidth of the phase-locked loop circuit is less than a bandwidth threshold. The first voltage-current conversion unit and the second voltage-current conversion unit, respectively configured to convert the received second control voltage signal VC2 into a current signal and configured to convert the received first control voltage signal VC1 into a current signal to obtain two current signals, and input the two current signals to a current-controlled oscillator. The current-controlled oscillator configured to generate, according to the two current signals, a phase-locked loop output signal whose frequency is a target frequency, and the frequency divider, of which one end is coupled to the current-controlled oscillator and the other end is coupled to the phase frequency detector configured to perform frequency division on the frequency of the phase-locked loop output signal that is output by the current-controlled oscillator, and use a signal that is obtained after the frequency division as a frequency division feedback signal and send the signal to the phase frequency detector.

With reference to the first aspect, in a first implementation manner of the first aspect, the phase-locked loop circuit further includes a comparator, coupled to the first node, the second node, and the mode controller, and configured to receive a voltage VM1 at the first node and a voltage VM2 at the second node, determine an output signal according to a differential mode voltage between the VM1 and the VM2, and send the output signal to the mode controller, where correspondingly, the mode controller is further configured to control, according to the output signal of the comparator, the S1 to alternatively connect and disconnect.

With reference to the first implementation manner of the first aspect, in a second implementation manner of the first aspect, the comparator is further configured to compare a first voltage threshold with a value of the differential mode voltage between the VM1 and the VM2, and generate a first level signal as the output signal and send the first level signal to the mode controller when the value of the differential mode voltage between the VM1 and the VM2 is greater than the first voltage threshold, or generate a second level signal as the output signal and send the second level signal to the mode controller when the value of the differential mode voltage between the VM1 and the VM2 is not greater than the first voltage threshold, where the mode controller is further configured to control the switch S1 to connect when receiving the first level signal, or control the switch S1 to disconnect when receiving the second level signal.

With reference to the second implementation manner of the first aspect, in a third implementation manner of the first aspect, the comparator includes a common-mode voltage generator configured to receive the voltage VM1 at the first node and the voltage VM2 at the second node, and generate a common-mode voltage of the VM1 and the VM2, a determining component, of which one end is connected to a selector and the other end is connected to the common-mode voltage generator configured to compare a second voltage threshold with the common-mode voltage generated by the common-mode voltage generator, and output a first instruction signal to the selector when the common-mode voltage is less than the second voltage threshold, or output a second instruction signal to the selector when a common-mode voltage (VCM) is greater than the second voltage threshold. The selector configured to receive the first instruction signal that is output by the determining component, select to receive, according to the first instruction signal, a first output signal that is generated by a first comparator, and uses the first output signal as the output signal of the comparator, or configured to receive the second instruction signal that is output by the determining component, select to receive, according to the second instruction signal, a second output signal that is generated by a second comparator, and uses the second output signal as the output signal of the comparator. The first comparator configured to generate the first level signal or the second level signal as the first output signal when the VCM of the voltage VM1 at the first node and the voltage VM2 at the second node is less than the second voltage threshold, and the second comparator configured to generate the first level signal or the second level signal as the second output signal when the VCM of the voltage VM1 at the first node and the voltage VM2 at the second node is greater than the second voltage threshold.

With reference to the third implementation manner of the first aspect, in a fourth implementation manner of the first aspect, the first comparator includes a p-channel metal oxide semiconductor (PMOS) transconductance input stage configured to convert each of the voltage VM1 at the first node and the voltage VM2 at the second node into a current signal to obtain two current signals, and send the two current signals to an n-channel metal oxide semiconductor (NMOS) output stage, and the NMOS output stage is configured to convert each of the two received current signals into a voltage signal to obtain two voltage signals, compare the first voltage threshold with the value of the differential mode voltage between the two voltage signals, and generate the first level signal as the first output signal when the value of the differential mode voltage between the two voltage signals is greater than the first voltage threshold, or generate the second level signal as the first output signal when the value of the differential mode voltage between the two voltage signals is not greater than the first voltage threshold, and the second comparator includes an NMOS transconductance input stage configured to convert each of the voltage VM1 at the first node and the voltage VM2 at the second node into a current signal to obtain two current signals, and send the two current signals obtained after the conversion to a PMOS output stage, and the PMOS output stage configured to convert each of the two received current signals into a voltage signal to obtain two voltage signals, compare the first voltage threshold with the value of the differential mode voltage between the two voltage signals, and generate the first level signal as the second output signal when the value of the differential mode voltage between the two voltage signals is greater than the first voltage threshold, or generate the second level signal as the second output signal when the value of the differential mode voltage between the two voltage signals is not greater than the first voltage threshold.

With reference to the first aspect or the first, the second, the third, or the fourth implementation manner of the first aspect, in a fifth implementation manner of the first aspect, the mode controller is further configured to control the S1 to connect, the S2 to disconnect, and the S3 to connect in the loop low-pass filter when the bandwidth of the phase-locked loop circuit is not less than the bandwidth threshold.

With reference to the first aspect or the first, the second, the third, the fourth, or the fifth implementation manner of the first aspect, in a sixth implementation manner of the first aspect, the first voltage-current conversion unit includes a first metal oxide semiconductor (MOS) transistor, the second voltage-current conversion unit includes a second MOS transistor, and the second MOS transistor is smaller than the first MOS transistor in size, where a gate of the second MOS transistor receives an input voltage VC1, a source of the second MOS transistor is connected to the current-controlled oscillator, and a drain of the second MOS transistor is connected to a power supply voltage, and a gate of the first MOS transistor receives an input voltage VC2, a source of the first MOS transistor is connected to the current-controlled oscillator, and a drain of the first MOS transistor is connected to the power supply voltage.

With reference to the first aspect or the first, the second, the third, the fourth, or the fifth implementation manner of the first aspect, in a seventh implementation manner of the first aspect, the phase-locked loop circuit further includes a transconductance-element low-pass filter configured to filter high-frequency noise in a power supply voltage, where the first voltage-current conversion unit includes a first MOS transistor and a third MOS transistor, the second voltage-current conversion unit includes a second MOS transistor and a fourth MOS transistor, the second MOS transistor is smaller than the first MOS transistor in size, and the fourth MOS transistor is smaller than the third MOS transistor in size. A gate of the second MOS transistor receives an input voltage VC1, a source of the second MOS transistor is connected to the current-controlled oscillator, and a drain of the second MOS transistor is connected to a source of the fourth MOS transistor. A gate of the fourth MOS transistor is connected to the transconductance-element low-pass filter, the source of the fourth MOS transistor is connected to the drain of the second MOS transistor, and a drain of the fourth MOS transistor is connected to the power supply voltage. A gate of the first MOS transistor receives an input voltage VC2, a source of the first MOS transistor is connected to the current-controlled oscillator, and a drain of the first MOS transistor is connected to a source of the third MOS transistor. A gate of the third MOS transistor is connected to the transconductance-element low-pass filter, the source of the third MOS transistor is connected to the drain of the first MOS transistor, and a drain of the third MOS transistor is connected to the power supply voltage.

With reference to the seventh implementation manner of the first aspect, in an eighth implementation manner of the first aspect, the transconductance-element low-pass filter includes a resistor Rs1 and a capacitor Cs1, where one end of the resistor Rs1 is connected to the power supply voltage and the other end of the resistor Rs1 is connected to the capacitor Cs1.

With reference to the first aspect or the first, the second, the third, the fourth, the fifth, the sixth, the seventh, or the eighth implementation manner of the first aspect, in a ninth implementation manner of the first aspect, a time constant of a circuit that includes the resistor and the capacitor in the first filter unit is greater than a time constant of a circuit that includes the resistor and the capacitor in the second filter unit.

According to a second aspect, the present disclosure provides a data recovery circuit, where the data recovery circuit includes the phase-locked loop circuit according to the first aspect or any implementation manner of the first aspect, a frequency detector, a phase detector, and a data selector, where the frequency detector is coupled to the data selector, and is configured to detect whether frequencies of a reference source signal and a feedback signal in the phase-locked loop circuit are consistent, and output a first control instruction to the data selector if the frequencies are inconsistent, or output a second control instruction to the data selector if the frequencies are consistent. The data selector is coupled to the phase detector, the frequency detector, and a phase frequency detector and a charge pump that are in the phase-locked loop circuit, and is configured to select to connect the phase frequency detector and the charge pump according to the first control instruction that is output by the frequency detector, or configured to select to connect the phase detector and the charge pump according to the second control instruction that is output by the frequency detector, and the phase detector is coupled to the data selector and a current-controlled oscillator that is in the phase-locked loop circuit, and is configured to compare a received link data signal with a first feedback signal that is output by the current-controlled oscillator when the phase-locked loop circuit is locked, generate a second error signal, and recover a data signal in the link data signal according to a second feedback signal that is output by the current-controlled oscillator when the link data signal is locked by the current-controlled oscillator, where the second error signal includes a phase error between the link data signal and the first feedback signal.

According to a third aspect, the present disclosure provides a control method for a phase-locked loop circuit, where the control method includes generating a first control voltage signal VC1 to provide for a second voltage-current conversion unit in the phase-locked loop circuit, generating a second control voltage signal VC2 to provide for a first voltage-current conversion unit in the phase-locked loop circuit, controlling an S1 to alternatively connect and disconnect, an S2 to connect, and an S3 to disconnect in a loop low-pass filter in the phase-locked loop circuit when a bandwidth of the phase-locked loop circuit is less than a bandwidth threshold, where the loop low-pass filter includes a first filter unit, a second filter unit, a third node, a fourth node, the switch S1, the switch S2, and the switch S3. The first filter unit includes a first resistor R1 and a first capacitor C1, and the R1 and the C1 are connected in series. The second filter unit includes a second resistor R2 and a second capacitor C2, and the R2 and the C2 are connected in series. The third node is a node for taking out the VC1, the fourth node is a node for taking out the VC2, one end of the S1 is coupled to a first node between the R1 and the C1, and the other end is coupled to a second node between the R2 and the C2, two ends of the S2 are respectively coupled to the first node and the fourth node, and two ends of the S3 are respectively coupled to the third node and the fourth node.

With reference to the third aspect, in a first implementation manner of the third aspect, controlling the S1 to alternatively connect and disconnect includes comparing a first voltage threshold with a value of a differential mode voltage between a voltage VM1 at the first node and a voltage VM2 at the second node, and controlling the switch S1 to connect when the value of the differential mode voltage between the VM1 and the VM2 is greater than the first voltage threshold, or controlling the switch S1 to disconnect when the value of the differential mode voltage between the VM1 and the VM2 is not greater than the first voltage threshold.

With reference to the third aspect or the first implementation manner of the third aspect, in a second implementation manner of the third aspect, the control method further includes controlling the S1 to connect, the S2 to disconnect, and the S3 to connect in the loop low-pass filter when the bandwidth of the phase-locked loop circuit is not less than the bandwidth threshold.

According to the phase-locked loop circuit provided in the embodiments of the present disclosure, a loop low-pass filter includes switches S1, S2, and S3, and in a process in which locking is implemented in the phase-locked loop circuit, a mode controller may increase, by controlling the S1 to alternatively connect and disconnect, a rising speed of a voltage VM1 at a first node between a first resistor R1 and a first capacitor C1 in a first filter unit in order to increase a rising speed of a voltage value of a second control voltage signal VC2 provided for a first voltage-current conversion unit such that the voltage value of the second control voltage signal VC2 can reach, in a relatively short time, a voltage value of a first control voltage signal VC1 provided for a second voltage-current conversion unit, thereby increasing a speed of establishing the phase-locked loop circuit and implementing a quick response of the phase-locked loop circuit.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
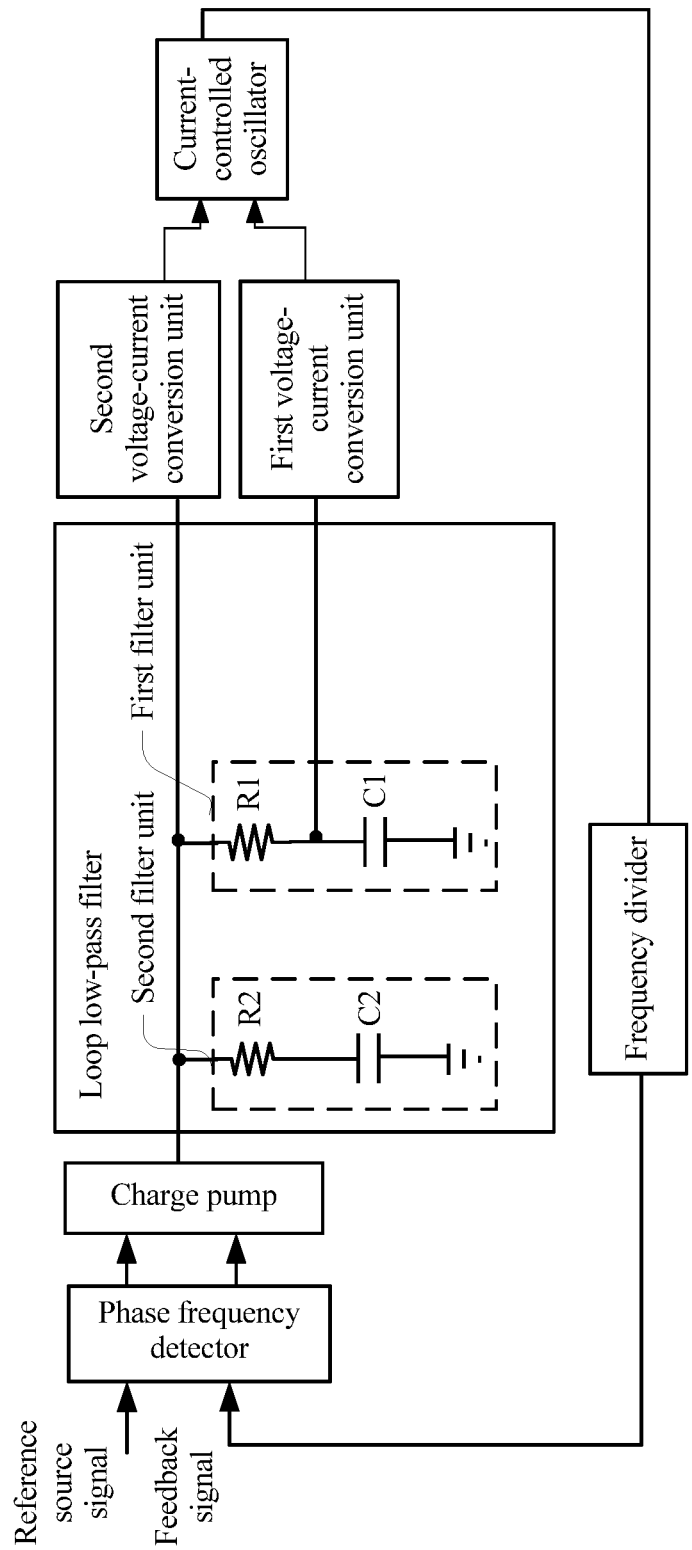
FIG. 1 is a schematic structural diagram of a dual-loop phase-locked loop circuit.
Figure 2:
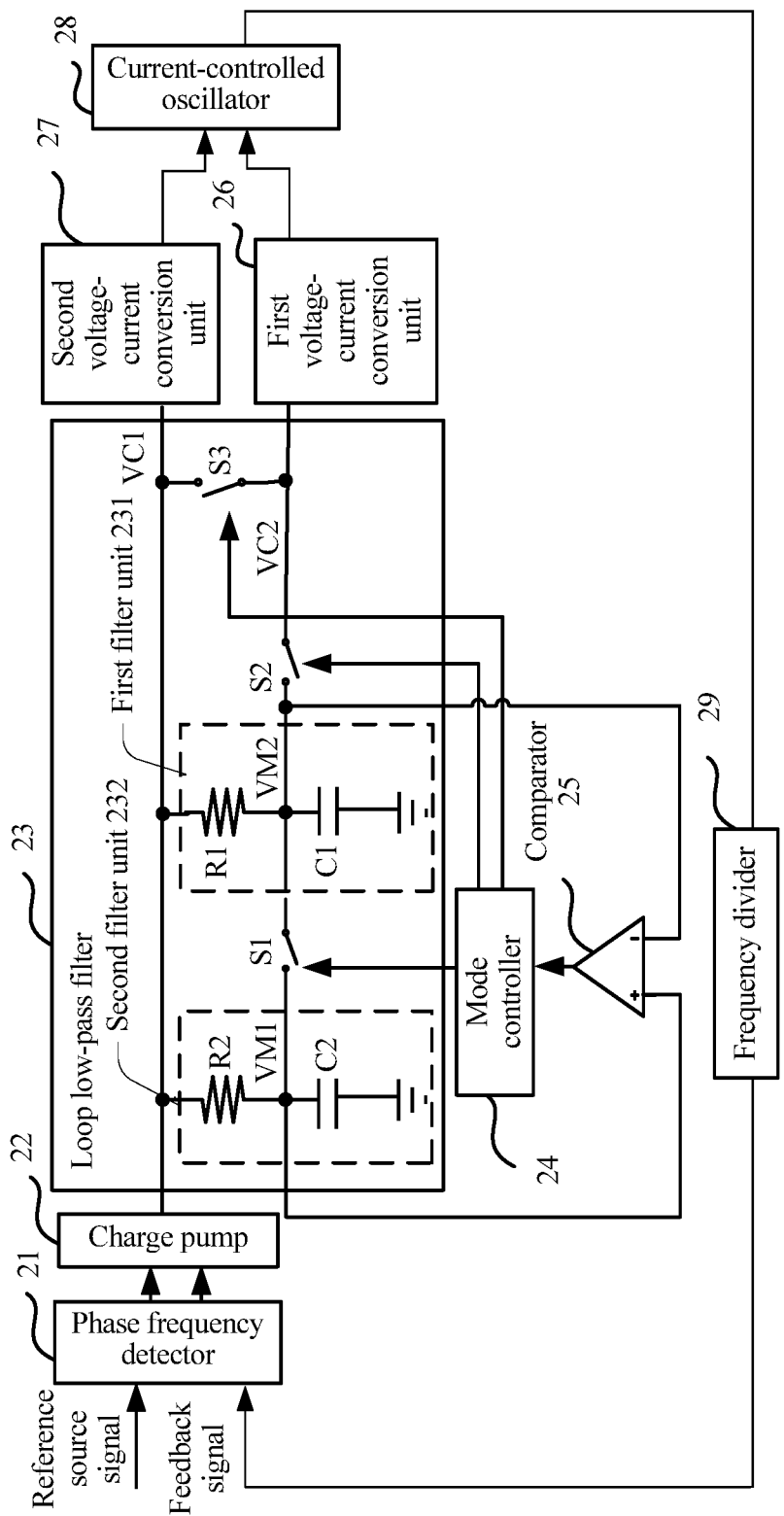
FIG. 2 is a schematic structural diagram of a phase-locked loop circuit according to an embodiment of the present disclosure.

FIG. 2 illustrates a schematic structural diagram of a phase-locked loop circuit according to an embodiment of the present disclosure. The phase-locked loop circuit includes a phase frequency detector 21 configured to receive a reference source signal and a feedback signal that is output by a frequency divider 29, and generate a first error signal, where the first error signal includes a frequency error and a phase error that are between the reference source signal and the feedback signal, a charge pump 22, coupled to the phase frequency detector 21, and configured to generate a first voltage signal according to the first error signal that is output by the phase frequency detector 21, and send the first voltage signal to a loop low-pass filter 23. The loop low-pass filter 23, including a first filter unit 231, a second filter unit 232, a third node, and a fourth node, where the first filter unit 231 is configured to filter out a high frequency component in the first voltage signal that is output by the charge pump 22 and generate a first control voltage signal VC1 to provide for a second voltage-current conversion unit 27. The second filter unit 232 is configured to filter out a high frequency component in the first voltage signal that is output by the charge pump 22 and generate a second control voltage signal VC2 to provide for a first voltage-current conversion unit 26. The first filter unit 231 includes a first resistor R1 and a first capacitor C1, where the R1 and the C1 are connected in series. The second filter unit 232 includes a second resistor R2 and a second capacitor C2, where the R2 and the C2 are connected in series. The third node is a node for taking out the first control voltage signal VC1, and the fourth node is a node for taking out the second control voltage signal VC2, where the loop low-pass filter 23 further includes a switch S1, a switch S2, and a switch S3, where one end of the S1 is coupled to a first node between the first resistor R1 and the first capacitor C1, and the other end is coupled to a second node between the second resistor R2 and the second capacitor C2, two ends of the S2 are respectively coupled to the first node and the fourth node, and two ends of the S3 are respectively coupled to the third node and the fourth node, the first voltage-current conversion unit 26 configured to convert the second control voltage signal VC2 into a first current signal, and input the first current signal to a current-controlled oscillator 28. The second voltage-current conversion unit 27 configured to convert the first control voltage signal VC1 into a second current signal, and input the second current signal to the current-controlled oscillator 28. The current-controlled oscillator 28 configured to generate, according to the received first current signal and the received second current signal, a phase-locked loop output signal whose frequency is a target frequency, and send the phase-locked loop output signal to the frequency divider 29, and the frequency divider 29, of which one end is coupled to the current-controlled oscillator 28 and the other end is coupled to the phase frequency detector 21 configured to perform frequency division on the frequency of the phase-locked loop output signal that is output by the current-controlled oscillator 28, and send a signal obtained after the frequency division to the phase frequency detector 21.

In the present disclosure, a rising speed of a voltage value of a second control voltage signal VC2 is increased to overcome the disadvantage of the dual-loop phase-locked loop circuit described in the background. Further, in the present disclosure, switches S1, S2, and S3 are disposed in a loop low-pass filter, and the rising speed of the voltage value of the VC2 is increased by controlling the switches S1, S2, and S3 to connect or disconnect. Therefore, the voltage value of the second control voltage signal VC2 can reach a voltage value of a first control voltage signal VC1 in a relatively short time.

The following further describes how to increase the rising speed of the voltage value of the VC2 by controlling the switches S1, S2, S3 to connect or disconnect.

A mode controller 24 is coupled to a comparator 25 and the loop low-pass filter 23, and is configured to control the S1, S2, and S3 to connect or disconnect. Further, the mode controller 24 is coupled to the switches S1, S2, and S3 in the loop low-pass filter 23, and is configured to control the S1, S2, and S3 to connect or disconnect. The mode controller 24 provides different policies for controlling the S1, S2, and S3 to connect or disconnect if a bandwidth of the phase-locked loop circuit varies, which is further described as follows.

(1) When the bandwidth of the phase-locked loop circuit is less than a bandwidth threshold (the bandwidth of the phase-locked loop circuit is a small loop bandwidth), where the bandwidth threshold is an empirical value, for example, 1 megahertz (MHz), the mode controller 24 is configured to control the switch S1 to alternatively connect and disconnect, the S2 to connect, and the S3 to disconnect.

In an embodiment of the present disclosure, in an implementation manner in which the mode controller 24 controls the switch S1 to alternatively connect and disconnect, a comparator 25 is disposed in the phase-locked loop circuit such that the mode controller 24 controls, according to an output signal of the comparator 25, the S1 to alternatively connect and disconnect.

The comparator 25 is coupled to the first node, the second node, and the mode controller 24, and is configured to receive a voltage VM1 at the first node and a voltage VM2 at the second node, determine the output signal according to a differential mode voltage between the VM1 and the VM2, and send the output signal to the mode controller 24. Exemplarily, an input end of the comparator 25 includes a positive input end and a negative input end, where the positive input end is coupled to the first node, and the negative input end is coupled to the second node.

Further, the comparator 25 compares a first voltage threshold with the differential mode voltage between the VM1 and the VM2. The comparator 25 generates a first level signal as the output signal and sends the first level signal to the mode controller 24 when the differential mode voltage between the VM1 and the VM2 is greater than the first voltage threshold, or the comparator 25 generates a second level signal as the output signal and sends the second level signal to the mode controller 24 when the differential mode voltage between the VM1 and the VM2 is not greater than the first voltage threshold, where the first voltage threshold may be determined according to a current source and a resistor that are inside the comparator 25, which is not limited in the present disclosure.

Correspondingly, that the mode controller 24 controls, according to an output signal of the comparator 25, the S1 to alternatively connect and disconnect further includes controlling, by the mode controller 24, the switch S1 to connect when the output signal of the comparator 25 is the first level signal, or controlling, by the mode controller 24, the switch S1 to disconnect when the output signal of the comparator 25 is the second level signal. Exemplarily, the first level signal may be a high-level signal and the second level signal may be a low-level signal, or the first level signal may be a low-level signal and the second level signal may be a high-level signal, which is not limited in the present disclosure.

It should be noted that the mode controller 24 controls the switch S1 to be connected for a period of time T1 when the output signal of the comparator 25 is the first level signal. During the period of time T1, a charge in the capacitor C1 is continuously transferred to the capacitor C2, which decreases the VM1 and increases the VM2, until the differential mode voltage between the VM1 and the VM2 is not greater than the first voltage threshold. The output signal of the comparator 25 is adaptively adjusted to the second level signal. Then, the mode controller 24 controls the switch S1 to be disconnected for a period of time T2. During the period of time T2, a rising speed of a voltage value of the VM1 is much faster than that of a voltage value of the VM2, and the switch S1 is connected again until the differential mode voltage between the VM1 and the VM2 is greater than the first voltage threshold. The foregoing process is repeatedly performed. Therefore, the switch S1 is alternatively connected and disconnected.

(2) When the bandwidth of the phase-locked loop circuit is not less than the bandwidth threshold (the bandwidth of the phase-locked loop circuit is a large loop bandwidth), the mode controller 24 is configured to control the S1 to connect, the S2 to disconnect, and the S3 to connect in the loop low-pass filter 23.

In this case, the phase-locked loop circuit is a single-loop phase-locked loop circuit, and because the bandwidth of the phase-locked loop circuit is relatively large, the phase-locked loop circuit may respond quickly.

It should be noted that, a larger bandwidth of the phase-locked loop circuit indicates worse rejection of a frequency change of the reference source signal by a phase-locked loop circuit and a shorter locking time of the phase-locked loop circuit, and a smaller bandwidth of the phase-locked loop circuit indicates better rejection of a frequency change of the reference source signal by a phase-locked loop circuit and a longer locking time of the phase-locked loop circuit. In practice, the bandwidth of the phase-locked loop circuit is switched between a large loop bandwidth and a small loop bandwidth. In addition, in the present disclosure, the mode controller may directly receive bandwidth information of the phase-locked loop circuit that is sent by an external component (such as a processor), and how the mode controller acquires the bandwidth information of the circuit is not limited in the present disclosure.

In the present disclosure, a comparator is disposed in a phase-locked loop circuit. At the beginning of running the phase-locked loop circuit, because in a loop low-pass filter, a value on a resistor R2 is far less than a value on a resistor R1 and a switch S1 is disconnected, a rising speed of a voltage VM1 is far faster than a rising speed of a voltage VM2. To increase the rising speed of the VM2, the comparator sends a first level signal to a mode controller when the comparator determines that a differential mode voltage between the VM1 and the VM2 is greater than a voltage threshold, and the mode controller controls, according to the first level signal, the switch S1 to be connected for a period of time T1 such that during the period of time T1, a charge in a capacitor C2 is transferred into a capacitor C1, thereby increasing the VM2, or the comparator sends a second level signal to a mode controller when the comparator determines that a differential mode voltage between the VM1 and the VM2 is not greater than a voltage threshold, and the mode controller controls, according to the second level signal, the switch S1 to disconnect. Because the value on the resistor R2 is much less than the value on the resistor R1 and the S1 is disconnected, the rising speed of the VM1 is still faster than that of the VM2, the comparator and the mode controller continue to repeat the foregoing processing process.

Therefore, in a process in which locking is implemented in the phase-locked loop circuit, a mode controller may increase, by controlling an S1 to alternatively connect and disconnect, a rising speed of a voltage VM1 at a first node between a first resistor R1 and a first capacitor C1 in a first filter unit in order to increase a rising speed of a voltage value of a second control voltage signal VC2 provided for a first voltage-current conversion unit such that the voltage value of the second control voltage signal VC2 can reach, in a relatively short time, a voltage value of a first control voltage signal VC1 provided for a second voltage-current conversion unit, thereby increasing a speed of establishing the phase-locked loop circuit and implementing a quick response of the phase-locked loop circuit.

Figure 3A:
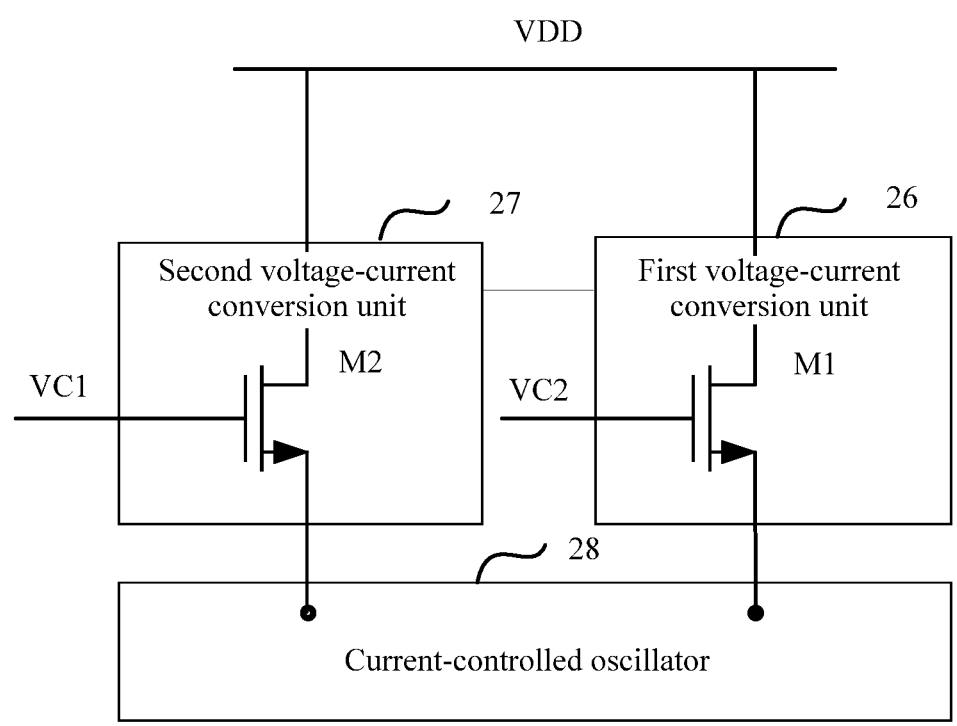
FIG. 3A is a schematic structural diagram of a circuit including a first voltage-current conversion unit and a second voltage-current conversion unit according to an embodiment of the present disclosure.

FIG. 3A illustrates a structure including a second voltage-current conversion unit 27 and a first voltage-current conversion unit 26 according to an embodiment of the present disclosure.

The first voltage-current conversion unit 26 includes a first MOS transistor M1, and the second voltage-current conversion unit 27 includes a second MOS transistor M2, where the M2 is smaller than the M1 in size. Therefore, the second voltage-current conversion unit 27 has a low voltage-current conversion gain, and the first voltage-current conversion unit 26 has a high voltage-current conversion gain.

A gate of the M2 is connected to an input voltage VC1, a source of the M2 is connected to a current-controlled oscillator 28, and a drain of the M2 is connected to a power supply voltage VDD, where the power supply voltage VDD provides power for the first voltage-current conversion unit and the second voltage-current conversion unit.

A gate of the M1 is connected to an input voltage VC2, a source of the M1 is connected to the current-controlled oscillator 28, and a drain of the M1 is connected to the power supply voltage VDD.

In the first voltage-current conversion unit 26 and the second voltage-current conversion unit 27 that are illustrated in FIG. 3A, because noise in the power supply voltage VDD is coupled to the current-controlled oscillator 28 using the M1 and the M2, power supply rejection ratios (PSRRs) of the first voltage-current conversion unit 26 and the second voltage-current conversion unit 27 are relatively small. To increase the PSRRs of the first voltage-current conversion unit 26 and the second voltage-current conversion unit 27, a second voltage-current conversion unit 27 and a first voltage-current conversion unit 26 according to the following embodiment corresponding to FIG. 3B may also be used in the present disclosure.

Figure 3B:
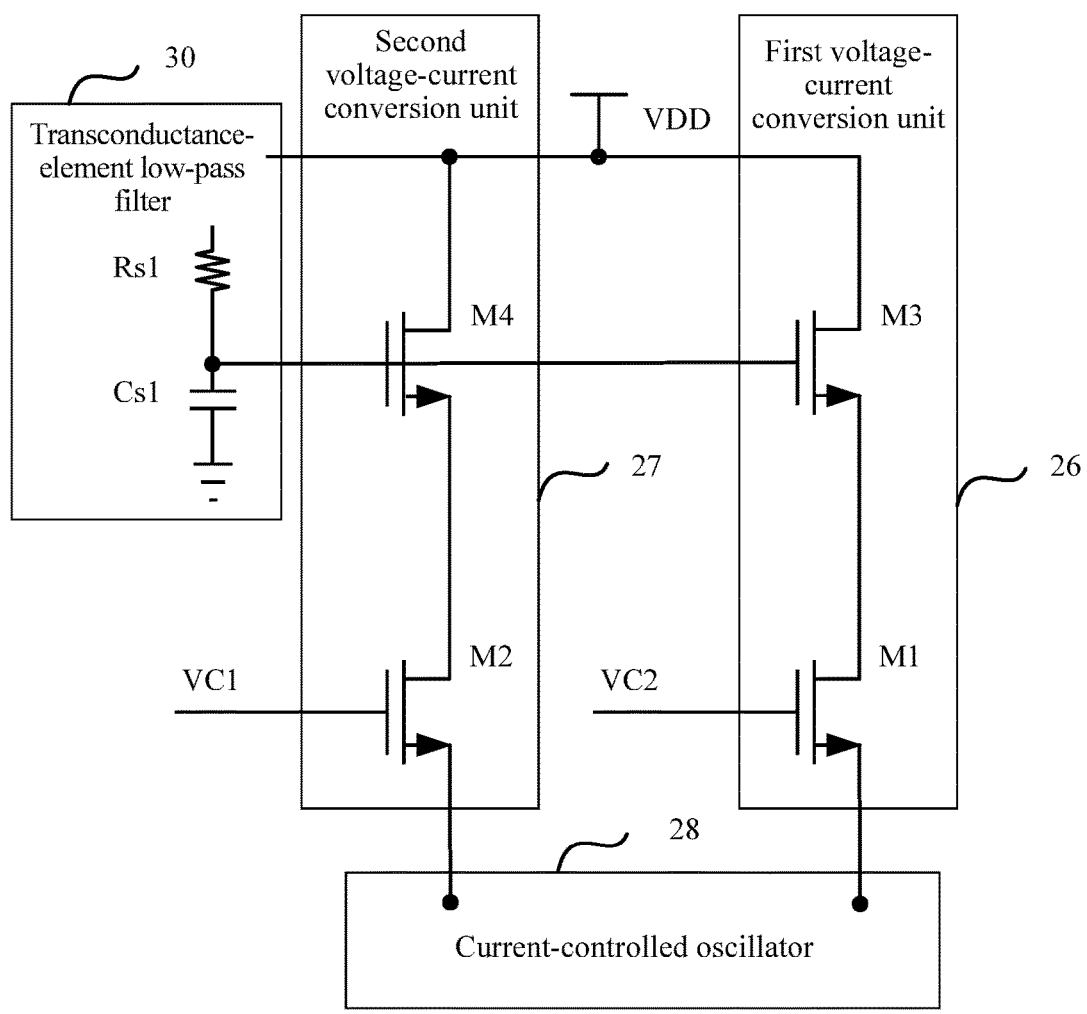
FIG. 3B is a schematic structural diagram of a circuit including a first voltage-current conversion unit and a second voltage-current conversion unit according to another embodiment of the present disclosure.

FIG. 3B illustrates a structure including a second voltage-current conversion unit 27 and a first voltage-current conversion unit 26 according to another embodiment of the present disclosure. In this structure including the first voltage-current conversion unit 26 and the second voltage-current conversion unit 27, a transconductance-element low-pass filter 30 needs to be further added in the phase-locked loop circuit. The transconductance-element low-pass filter 30 and the loop low-pass filter 23 are two different filters. For ease of description, in the present disclosure, the structure of a phase-locked loop circuit corresponding to FIG. 2 does not include the transconductance-element low-pass filter 30, and only a schematic partial view including the transconductance-element low-pass filter 30, the second voltage-current conversion unit 27, the first voltage-current conversion unit 26, and the current-controlled oscillator 28 is exemplarily shown in FIG. 3B.

The transconductance-element low-pass filter 30 is configured to filter out high-frequency noise in a power supply voltage VDD in order to implement a function of rejecting power supply noise. Further, the transconductance-element low-pass filter 30 includes a resistor Rs1 and a capacitor Cs1, where one end of the resistor Rs1 is connected to the power supply voltage VDD, and the other end of the resistor Rs1 is connected to a filtering capacitor Cs1.

The first voltage-current conversion unit 26 includes a first MOS transistor M1 and a third MOS transistor M3, and the second voltage-current conversion unit 27 includes a second MOS transistor M2 and a fourth MOS transistor M4, where the M2 is smaller than the M1 in size, and the M4 is smaller than the M3 in size. Therefore, the second voltage-current conversion unit 27 has a low voltage-current conversion gain, and the first voltage-current conversion unit 26 has a high voltage-current conversion gain.

A gate of the M2 is connected to an input voltage VC1, a source of the M2 is connected to a current-controlled oscillator 28, and a drain of the M2 is connected to a source of the M4.

A gate of the M4 is connected to the transconductance-element low-pass filter 30, the source of the M4 is connected to the drain of the M2, and a drain of the M4 is connected to the power supply voltage VDD.

A gate of the M1 is connected to an input voltage VC2, a source of the M1 is connected to the current-controlled oscillator 28, and a drain of the M1 is connected to a source of the M3.

A gate of the M3 is connected to the transconductance-element low-pass filter 30, the source of the M3 is connected to the drain of the Ml, and a drain of the M3 is connected to the power supply voltage VDD.

The M4 is added between the M2 and the power supply voltage VDD, the M3 is added between the M1 and the power supply voltage VDD, both the gate of the M4 and the gate of the M3 are connected to the transconductance-element low-pass filter 30, and the transconductance-element low-pass filter 30 can filter out high-frequency noise in the power supply voltage. Therefore, the M4 and the M3 can reject interference of noise in the power supply voltage VDD to the M2 and the Ml, thereby increasing PSRRs of the second voltage-current conversion unit 27 and the first voltage-current conversion unit 26.

Figure 4:
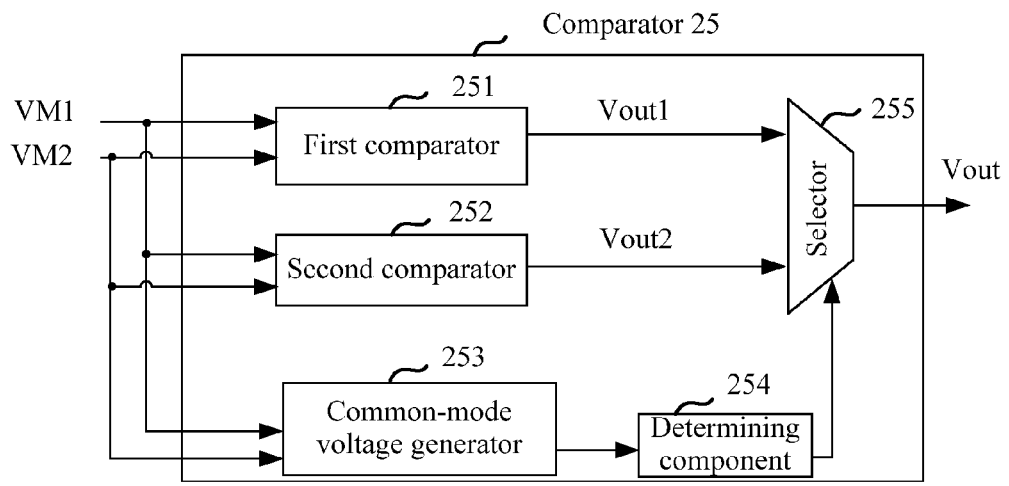
FIG. 4 is a schematic structural diagram of a comparator in the phase-locked loop circuit illustrated in FIG. 2.

FIG. 4 illustrates a structure of a comparator 25 according to an embodiment of the present disclosure, where the comparator 25 includes a first comparator 251, a second comparator 252, a common-mode voltage generator 253, a determining component 254, and a selector 255.

The common-mode voltage generator 253 is configured to receive a voltage VM1 at a first node and a voltage VM2 at a second node, and generate a VCM of the VM1 and the VM2, where the VCM=0.5*VM1+0.5*VM2.

The determining component 254, of which one end is connected to the selector 255 and the other end is connected to the common-mode voltage generator 253, is configured to compare a second voltage threshold with the VCM generated by the common-mode voltage generator 253, where the second voltage threshold is an empirical threshold and may be generally half a value of a power source voltage of the comparator 25.

The determining component 254 outputs a first instruction signal to the selector 255 when the VCM is less than the second voltage threshold (i.e., the VCM is smaller) in order to instruct the selector 255 to select to receive a first output signal Vout1 that is output by the first comparator 251 and uses the first output signal Vout1 as an output signal of the comparator 25.

The determining component 254 outputs a second instruction signal to the selector 255 when the VCM is greater than the second voltage threshold (i.e., the VCM is larger) in order to instruct the selector 255 to select to receive a second output signal Vout2 that is output by the second comparator 252 and uses the second output signal Vout2 as an output signal of the comparator 25.

The determining component 254 may output a third instruction signal to the selector 255 in order to instruct the selector 255 to select either a first output signal Vout1 from the first comparator 251 or a second output signal Vout2 from the second comparator 252 as an output signal of the comparator 25 when the VCM is equal to the second voltage threshold.

The selector 255 is configured to receive the first instruction signal that is output by the determining component 254, select to receive, according to the first instruction signal, the first output signal Vout1 that is output by the first comparator 251, and uses the first output signal Vout1 as the output signal Vout of the comparator 25, or configured to receive the second instruction signal that is output by the determining component 254, select to receive, according to the second instruction signal, the second output signal Vout2 that is output by the second comparator 252, and uses the second output signal Vout2 as the output signal Vout of the comparator 25.

The first comparator 251 is configured to receive the voltage VM1 at the first node and the voltage VM2 at the second node and generate the first level signal or the second level signal as the first output signal when the VCM of the VM1 and the VM2 is less than the second voltage threshold, that is, the first comparator 251 can work normally only when the VCM of the VM1 and the VM2 is less than the second voltage threshold.

The second comparator 252 is configured to receive the voltage VM1 at the first node and the voltage VM2 at the second node and generate the first level signal or the second level signal as the second output signal when the VCM of the VM1 and the VM2 is greater than the second voltage threshold, that is, the second comparator 252 can work normally only when the VCM of the VM1 and the VM2 is greater than the second voltage threshold.

It should be noted that, both the first comparator 251 and the second comparator 252 can work normally when the VCM of the voltage VM1 at the first node and the voltage VM2 at the second node is equal to the second voltage threshold.

Figure 5:
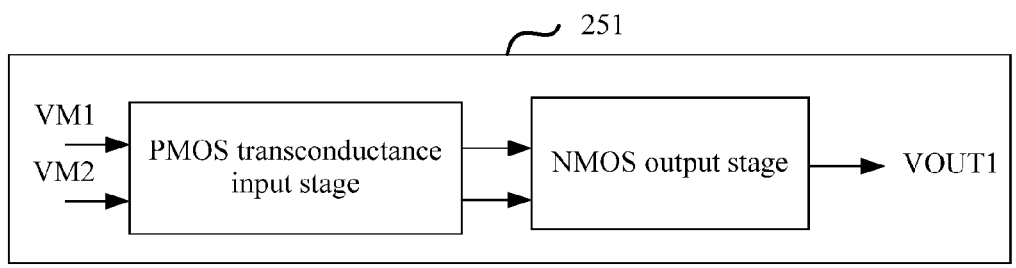
FIG. 5 is a schematic structural diagram of a first comparator in the comparator illustrated in FIG. 4.

Further, a specific structure of the first comparator 251 is shown in FIG. 5.

The first comparator 251 includes a PMOS transconductance input stage and an NMOS output stage.

The PMOS transconductance input stage is configured to convert each of the voltage VM1 at the first node and the voltage VM2 at the second node into a current signal to obtain two current signals, and send the two current signals to the NMOS output stage. Exemplarily, the PMOS transconductance input stage may include multiple resistors and multiple MOS transistors. A structure of the PMOS transconductance input stage is not limited in the present disclosure.

The NMOS output stage is configured to convert each of the two received current signals into a voltage signal to obtain two voltage signals, compare a first voltage threshold with a differential mode voltage between the two voltage signals, and generate the first level signal as the first output signal Vout1 when the differential mode voltage between the two voltage signals is greater than the first voltage threshold, or generate the second level signal as the first output signal Vout1 when the differential mode voltage between the two voltage signals is not greater than the first voltage threshold. Exemplarily, the NMOS output stage may include multiple resistors and multiple MOS transistors. A structure of the NMOS output stage is not limited in the present disclosure.

Figure 6:
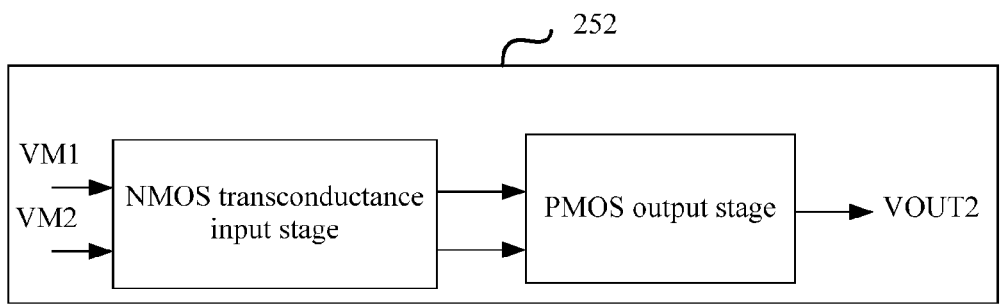
FIG. 6 is a schematic structural diagram of a second comparator in the comparator illustrated in FIG. 4.

Further, a specific structure of the second comparator 252 is shown in FIG. 6.

The second comparator includes an NMOS transconductance input stage and a PMOS output stage.

The NMOS transconductance input stage is configured to convert each of the voltage VM1 at the first node and the voltage VM2 at the second node into a current signal to obtain two current signals, and send the two current signals obtained after the conversion to the PMOS output stage. Exemplarily, the NMOS transconductance input stage may include multiple resistors and multiple MOS transistors, and a structure of the NMOS transconductance input stage is not limited in the present disclosure.

The PMOS output stage is configured to convert each of the two received current signals into a voltage signal to obtain two voltage signals, compare a first voltage threshold with a differential mode voltage between the two voltage signals, and generate the first level signal as the second output signal Vout2 when the differential mode voltage between the two voltage signals is greater than the first voltage threshold, or generate the second level signal as the second output signal Vout2 when the differential mode voltage between the two voltage signals is not greater than the first voltage threshold. Exemplarily, the PMOS output stage may include multiple resistors and multiple MOS transistors, and a structure of the PMOS output stage is not limited in the present disclosure.

Figure 7:
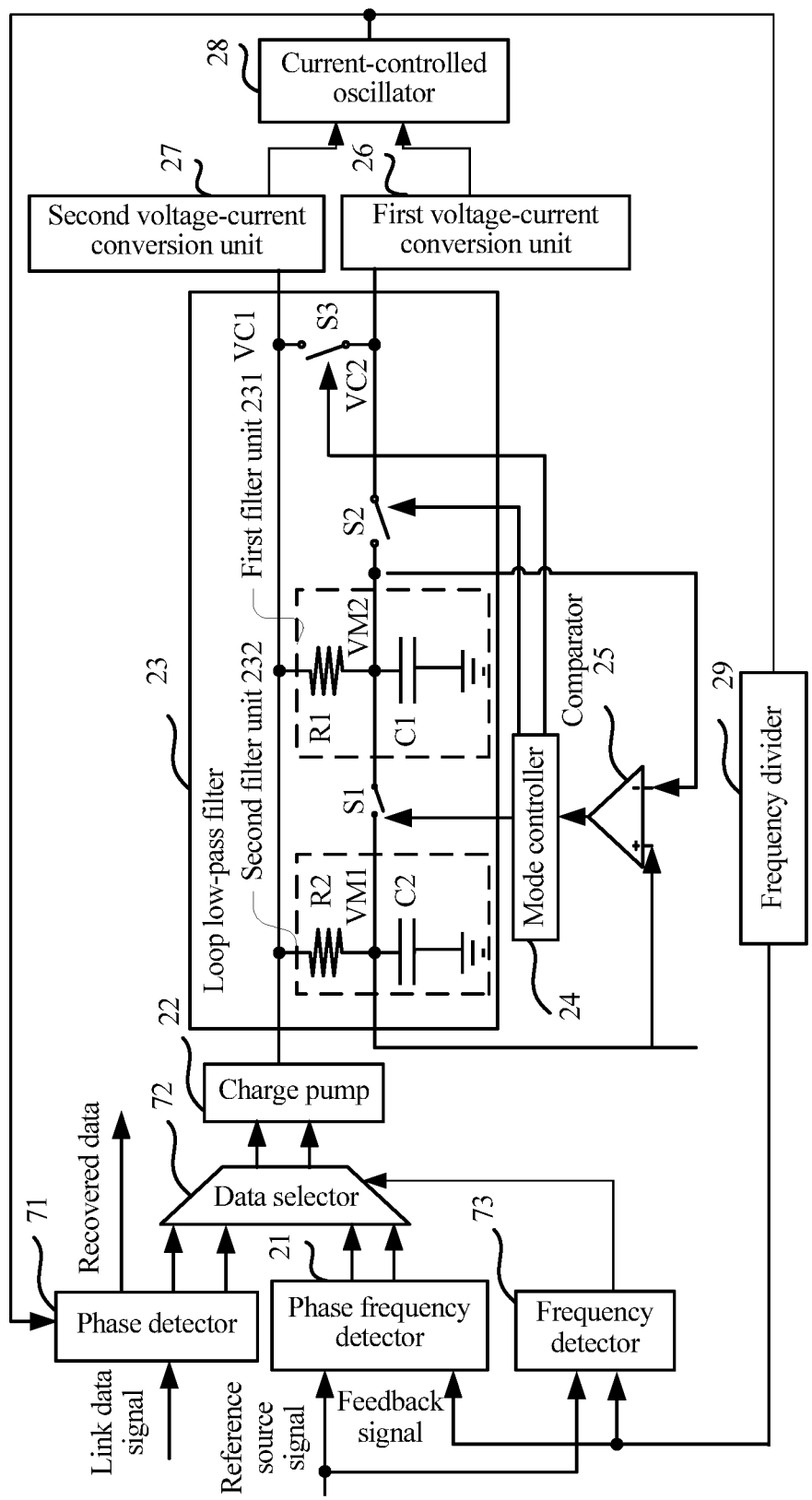
FIG. 7 is a schematic structural diagram of a data recovery circuit according to an embodiment of the present disclosure.

FIG. 7 illustrates a structure of a data recovery circuit according to an embodiment of the present disclosure. In the data recovery circuit, the phase-locked loop circuit described in the embodiment corresponding to FIG. 2 is used to implement data recovery. The following further describes the structure of the data recovery circuit.

Further, the data recovery circuit includes a phase frequency detector 21, a phase detector 71, a data selector 72, a charge pump 22, a loop low-pass filter 23, a first voltage-current conversion unit 26, a second voltage-current conversion unit 27, a current-controlled oscillator 28, a frequency divider 29, a mode controller 24, a comparator 25, and a frequency detector 73.

The phase frequency detector 21 is coupled to the data selector 72, and is configured to compare a received reference source signal with a feedback signal that is output by the phase-locked loop circuit, and generate a first error signal, where the first error signal includes a frequency error and a phase error that are between the reference source signal and the feedback signal.

The phase detector 71 is coupled to the current-controlled oscillator 28 and the data selector 72, and is configured to compare a received link data signal with a first feedback signal that is output by the current-controlled oscillator 28 when the phase-locked loop circuit is locked, and generate a second error signal, where the second error signal includes a phase error between the link data signal and the first feedback signal that is output by the current-controlled oscillator 28, and recover a data signal in the link data signal according to a second feedback signal that is output by the current-controlled oscillator 28 when the link data signal is locked by the current-controlled oscillator 28.

Further, in the data recovery circuit, when the data selector 72 selects to connect the phase detector 71 and the charge pump 22, it indicates that at this time, a frequency of the first feedback signal that is output by the current-controlled oscillator 28 is the same as a frequency of the reference source signal, that is, phase locking performed by a phase-locked loop circuit is complete. The phase detector 71 compares the received link data signal with the first feedback signal that is output by the current-controlled oscillator 28, and generates the second error signal, where the second error signal includes the phase error between the link data signal and the first feedback signal that is output by the current-controlled oscillator 28. The charge pump 22 generates a corresponding voltage signal according to the second error signal, and the loop low-pass filter 23 filters out high-frequency noise in the voltage signal. The voltage signal is converted into a current signal using the first voltage-current conversion unit 26 and the second voltage-current conversion unit 27, and the current signal works on the current-controlled oscillator 28 such that a frequency of an output signal of the current-controlled oscillator 28 approaches a frequency of the link data signal until a frequency difference is eliminated, thereby implementing locking of the link data signal by the current-controlled oscillator 28 again.

The frequency detector 73 is coupled to the data selector 72, and is configured to detect whether frequencies of the reference source signal and the feedback signal are consistent, and output a first control instruction to the data selector 72 if the frequencies are inconsistent, where the first control instruction is used to instruct the data selector 72 to select to connect the phase frequency detector 21 and the charge pump 22, or output a second control instruction to the data selector 72 if the frequencies are consistent, where the second control instruction is used to instruct the data selector 72 to select to connect the phase detector 71 and the charge pump 22. The data selector 72 is coupled to the phase frequency detector 21, the phase detector 71, the charge pump 22, and the frequency detector 73, and is configured to select to connect the phase frequency detector 21 and the charge pump 22 according to the first control instruction that is output by the frequency detector 73, or to select to connect the phase detector 71 and the charge pump 22 according to the second control instruction that is output by the frequency detector 73.

The charge pump 22 is coupled to the data selector 72, and is configured to receive the first error signal that is output by the phase frequency detector 21 or receive the second error signal that is output by the phase detector 71, generate the corresponding voltage signal according to the first error signal or the second error signal, and send the generated voltage signal to the loop low-pass filter 23.

Functions of the loop low-pass filter 23, the mode controller 24, the comparator 25, the first voltage-current conversion unit 26, the second voltage-current conversion unit 27, the current-controlled oscillator 28, and the frequency divider 29 are consistent with functions of corresponding components shown in FIG. 2. Therefore, reference may be made to related descriptions of the foregoing components in the embodiment corresponding to the FIG. 2. For ease of description, in the present disclosure, specific descriptions of the functions of the foregoing components are not provided herein.

It should be noted that the data recovery circuit provided in this embodiment is formed on the basis of the phase-locked loop circuit corresponding to FIG. 2. Further, the data recovery circuit mainly includes the phase frequency detector 21, the data selector 72, the charge pump 22, the loop low-pass filter 23, the mode controller 24, the comparator 25, the first voltage-current conversion unit 26, the second voltage-current conversion unit 27, the current-controlled oscillator 28, the frequency divider 29, and the frequency detector 73 when the data selector 72 selects to connect the phase frequency detector 21 and the charge pump 22. In this case, the data recovery circuit is mainly configured to implement a function of a phase-locked loop circuit, which is the same as a implementation process of the phase-locked loop circuit described in the embodiment corresponding to FIG. 2, and the phase detector 71 does not work in the phase locking process. When a phase is locked by the phase-locked loop circuit, that is, the frequency detector 71 detects that the frequencies of the reference source signal and the feedback signal are consistent in a process in which the phase-locked loop circuit works, the data selector 72 select to connect the phase detector 71 and the charge pump 22. In the data recovery circuit, a circuit including the phase detector 71, the data selector 72, the charge pump 22, the loop low-pass filter 23, the mode controller 24, the comparator 25, the first voltage-current conversion unit 26, the second voltage-current conversion unit 27, and the current-controlled oscillator 28 implements recovery of data information in the link data signal. The phase frequency detector 21 does not work in a process of recovering data from the link data signal.

Further, when the data recovery circuit implements recovery of the data information in the link data signal, because of a relatively small loop bandwidth of the circuit including the phase detector 71, the data selector 72, the charge pump 22, the loop low-pass filter 23, the mode controller 24, the comparator 25, the first voltage-current conversion unit 26, the second voltage-current conversion unit 27, and the current-controlled oscillator 28, the mode controller 24 controls an S2 to connect and an S3 to disconnect in the loop low-pass filter. In addition, because voltages VM1 and VM2 in the loop low-pass filter are similar at this time, the comparator 25 determines that a differential mode voltage between the VM1 and the VM2 is not greater than a first voltage threshold, generates a second level signal, uses the second level signal as an output signal, and sends the second level signal to the mode controller 24. The mode controller 24 controls, according to the second level signal that is output by the comparator 25, the S1 in the loop low-pass filter 23 to disconnect. Therefore, in a data recovery process, the mode controller 24 controls the S1 and an S3 to disconnect, and the S2 to connect. It can be learnt from this that in process in which locking is performed by the phase-locked loop circuit, the switch S1 is either connected or disconnected, but in a data recovery process, the switch S1 only remains disconnected.

Figure 8:
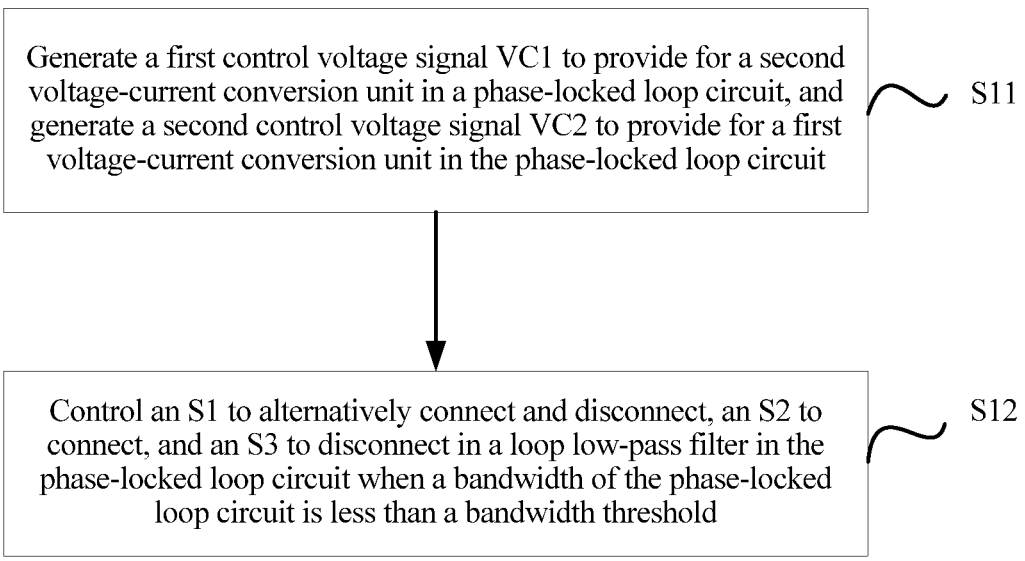
FIG. 8 is a flowchart diagram of a control method for a phase-locked loop circuit according to an embodiment of the present disclosure.

FIG. 8 illustrates a control method for a phase-locked loop circuit according to an embodiment of the present disclosure, where the phase-locked loop circuit to which the control method is applied is the phase-locked loop circuit described in the foregoing embodiments of the present disclosure. For ease of description, no specific description of a structure of the phase-locked loop circuit is provided in this embodiment, and for details, reference may be made to related descriptions of the structure of the phase-locked loop circuit according to the foregoing embodiments.

In this embodiment, the control method for the phase-locked loop circuit includes the following steps.

Step S11: Generate a first control voltage signal VC1 to provide for a second voltage-current conversion unit in the phase-locked loop circuit, and generate a second control voltage signal VC2 to provide for a first voltage-current conversion unit in the phase-locked loop circuit.

Step S12: Control an S1 to alternatively connect and disconnect, an S2 to connect, and an S3 to disconnect in a loop low-pass filter in the phase-locked loop circuit when a bandwidth of the phase-locked loop circuit is less than a bandwidth threshold.

The loop low-pass filter includes a first filter unit, a second filter unit, a third node, a fourth node, a switch S1, a switch S2, and a switch S3. The first filter unit includes a first resistor R1 and a first capacitor C1, where the R1 and the C1 are connected in series. The second filter unit includes a second resistor R2 and a second capacitor C2, where the R2 and the C2 are connected in series. The third node is a node for taking out the VC1. The fourth node is a node for taking out the VC2. One end of the S1 is coupled to a first node between the R1 and the C1, and the other end is coupled to a second node between the R2 and the C2. Two ends of the S2 are respectively coupled to the first node and the fourth node, and two ends of the S3 are respectively coupled to the third node and the fourth node. For details, reference may be made to related descriptions of a structure of a phase-locked loop circuit according to the foregoing embodiment.

Further, controlling the S1 to alternatively connect and disconnect includes comparing a first voltage threshold with a value of a differential mode voltage between a voltage VM1 at the first node and a voltage VM2 at the second node, and controlling the switch S1 to connect when the value of the differential mode voltage between the VM1 and the VM2 is greater than the first voltage threshold, or controlling the switch S1 to disconnect when the value of the differential mode voltage between the VM1 and the VM2 is not greater than the first voltage threshold.

Further, the control method for the phase-locked loop circuit further includes controlling the S1 to connect, the S2 to disconnect, and the S3 to connect in the loop low-pass filter when the bandwidth of the phase-locked loop circuit is not less than the bandwidth threshold.

It should be noted that only control-related method steps in the phase-locked loop circuit are described in this embodiment. In an actual process in which locking is performed by the phase-locked loop circuit, the foregoing method steps are combined with conventional method steps in the process in which locking is performed by the phase-locked loop circuit. The conventional method steps in the process in which locking is performed by the phase-locked loop circuit are not described in this embodiment, and other steps in a phase-locked loop implementation process except the foregoing control method are not limited in this embodiment.

According to the control method for the phase-locked loop circuit provided in this embodiment of the present disclosure, a loop low-pass filter includes switches S1, S2, and S3, and in a process in which locking is implemented in the phase-locked loop circuit, a mode controller may increase, by controlling the S1 to alternatively connect and disconnect, a rising speed of a voltage VM1 at a first node between a first resistor R1 and a first capacitor C1 in a first filter unit in order to increase a rising speed of a voltage value of a second control voltage signal VC2 provided for a first voltage-current conversion unit such that the voltage value of the second control voltage signal VC2 can reach, in a relatively short time, a voltage value of a first control voltage signal VC1 provided for a second voltage-current conversion unit, thereby increasing a speed of establishing the phase-locked loop circuit and implementing a quick response of the phase-locked loop circuit.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

It should be understood that though terms "first", "second", and the like are used in the present disclosure to describe multiple elements, components, and/or parts, these elements, components, and/or parts should not be limited to these terms, and these terms are only used to distinguish an element from another element, a component from another component, or a part from another part.

It should be understood that, a word "connect" or "couple" mentioned in the embodiments may be an indirect connection, and may not only indicate a direct connection between units or components using a wire, but also indicate a connection using another module or component.

Finally, it should be noted that the foregoing embodiments are merely intended for describing the technical solutions of the present disclosure but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:

1. A phase-locked loop circuit, comprising:
a first voltage-current converter;
a second voltage-current converter;
a current-controlled oscillator;
a frequency divider;
a phase frequency detector configured to:
  receive a reference source signal and a feedback signal that is output by the frequency divider; and
  generate a first error signal;
a charge pump coupled to the phase frequency detector and configured to generate a first voltage signal according to the first error signal that is output by the phase frequency detector;
a loop low-pass filter, comprising a first filter, a second filter, a third node, and a fourth node, a switch (S1), a switch (S2), and a switch (S3), wherein the first filter is configured to filter out a high frequency component in the first voltage signal that is output by the charge pump and generate a first control voltage signal (VC1) to provide for the second voltage-current converter, wherein the second filter is configured to filter out the high frequency component in the first voltage signal that is output by the charge pump and generate a second control voltage signal (VC2) to provide for the first voltage-current converter, wherein the first filter comprises a first resistor (R1) and a first capacitor (C1), wherein the R1 and the C1 are connected in series, wherein the second filter comprises a second resistor (R2) and a second capacitor (C2), wherein the R2 and the C2 are connected in series, wherein the third node is a node for taking out the VC1, wherein the fourth node is another node for taking out the VC2, wherein a first end of the S1 is coupled to a first node between the R1 and the C1, wherein a second end of the S1 is coupled to a second node between the R2 and the C2, wherein two ends of the S2 are respectively coupled to the first node and the fourth node, and wherein two ends of the S3 are respectively coupled to the third node and the fourth node; and
a mode controller coupled to the loop low-pass filter and configured to control the S1 to alternatively connect and disconnect, the S2 to connect, and the S3 to disconnect in the loop low-pass filter when a bandwidth of the phase-locked loop circuit is less than a bandwidth threshold,
wherein the first voltage-current converter is coupled to the loop low-pass filter and configured to:
  convert the received VC2 into a current signal; and
  input the current signal to the current-controlled oscillator;
wherein the second voltage-current converter is coupled to the loop low-pass filter and configured to:
  convert the received VC1 into another current signal; and
  input the other current signal to the current-controlled oscillator,
wherein the current-controlled oscillator is configured to generate, according to received current signals, a phase-locked loop output signal whose frequency is a target frequency,
wherein one end of the frequency divider is coupled to the current-controlled oscillator and the other end is coupled to the phase frequency detector, and
wherein the frequency divider is configured to:
  perform frequency division on the frequency of the phase-locked loop output signal that is output by the current-controlled oscillator;
  set a signal that is obtained after the frequency division as a frequency division feedback signal; and
  send the frequency division feedback signal to the phase frequency detector.

2. The phase-locked loop circuit according to claim 1, further comprising a comparator coupled to the first node, the second node, and the mode controller and configured to:
receive a voltage VM1 at the first node and a voltage VM2 at the second node;

determine an output signal according to a differential mode voltage between the VM1 and the VM2; and
send the output signal to the mode controller, and
wherein the mode controller is further configured to control, according to the output signal of the comparator, the S1 to alternatively connect and disconnect.

3. The phase-locked loop circuit according to claim 2, wherein the comparator is further configured to:
compare a first voltage threshold with a value of the differential mode voltage between the VM1 and the VM2; and
generate a first level signal as the output signal when the value of the differential mode voltage between the VM1 and the VM2 is greater than the first voltage threshold;
send the first level signal to the mode controller when the value of the differential mode voltage between the VM1 and the VM2 is greater than the first voltage threshold;
generate a second level signal as the output signal when the value of the differential mode voltage between the VM1 and the VM2 is not greater than the first voltage threshold; and
send the second level signal to the mode controller when the value of the differential mode voltage between the VM1 and the VM2 is not greater than the first voltage threshold, and
wherein the mode controller is further configured to:
control the S1 to connect when receiving the first level signal; and
control the S1 to disconnect when receiving the second level signal.

4. The phase-locked loop circuit according to claim 3, wherein the comparator comprises:
a selector;
a first comparator;
a common-mode voltage (VCM) generator configured to:
receive the voltage VM1 at the first node and the voltage VM2 at the second node; and
generate a VCM of the VM1 and the VM2; and
a determining component connected to the selector and the VCM generator and configured to:
compare a second voltage threshold with the VCM generated by the VCM generator;
output a first instruction signal to the selector when the VCM is less than the second voltage threshold; and
output a second instruction signal to the selector when the VCM is greater than the second voltage threshold,
wherein the selector is configured to:
receive the first instruction signal that is output by the determining component;
select to receive, according to the first instruction signal, a first output signal that is generated by the first comparator; and
set the first output signal as the output signal of the comparator, and
wherein the first comparator is configured to generate the first level signal as the first output signal when the VCM of the voltage VM1 at the first node and the voltage VM2 at the second node is less than the second voltage threshold.

5. The phase-locked loop circuit according to claim 3, wherein the comparator comprises:
a selector;
a first comparator;
a common-mode voltage (VCM) generator configured to:
receive the voltage VM1 at the first node and the voltage VM2 at the second node; and
generate a VCM of the VM1 and the VM2; and
a determining component connected to the selector and the VCM generator and configured to:
compare a second voltage threshold with the VCM generated by the VCM generator;
output a first instruction signal to the selector when the VCM is less than the second voltage threshold; and
output a second instruction signal to the selector when the VCM is greater than the second voltage threshold,
wherein the selector is configured to:
receive the first instruction signal that is output by the determining component;
select to receive, according to the first instruction signal, a first output signal that is generated by the first comparator; and
set the first output signal as the output signal of the comparator, and
wherein the first comparator is configured to generate the second level signal as the first output signal when the VCM of the voltage VM1 at the first node and the voltage VM2 at the second node is less than the second voltage threshold.

6. The phase-locked loop circuit according to claim 3, wherein the comparator comprises:
a selector;
a second comparator;
a common-mode voltage (VCM) generator configured to:
receive the voltage VM1 at the first node and the voltage VM2 at the second node; and
generate a VCM of the VM1 and the VM2; and
a determining component connected to the selector and the VCM generator and configured to:
compare a second voltage threshold with the VCM generated by the VCM generator;
output a first instruction signal to the selector when the VCM is less than the second voltage threshold; and
output a second instruction signal to the selector when the VCM is greater than the second voltage threshold,
wherein the selector is configured to:
receive the second instruction signal that is output by the determining component;
select to receive, according to the second instruction signal, a second output signal that is generated by the second comparator; and
set the second output signal as the output signal of the comparator, and
wherein the second comparator is configured to generate the first level signal as the second output signal when the VCM of the voltage VM1 at the first node and the voltage VM2 at the second node is greater than the second voltage threshold.

7. The phase-locked loop circuit according to claim 3, wherein the comparator comprises:
a selector;
a first comparator;
a common-mode voltage (VCM) generator configured to:
receive the voltage VM1 at the first node and the voltage VM2 at the second node; and
generate a VCM of the VM1 and the VM2; and
a determining component connected to the selector and the VCM generator and configured to:
compare a second voltage threshold with the VCM generated by the VCM generator;

output a first instruction signal to the selector when the VCM is less than the second voltage threshold; and output a second instruction signal to the selector when the VCM is greater than the second voltage threshold, wherein the selector is configured to:
receive the second instruction signal that is output by the determining component;
select to receive, according to the second instruction signal, a second output signal that is generated by the second comparator; and
set the second output signal as the output signal of the comparator, and wherein the second comparator is configured to generate the second level signal as the second output signal when the VCM of the voltage VM1 at the first node and the voltage VM2 at the second node is greater than the second voltage threshold.

8. The phase-locked loop circuit according to claim 4, wherein the first comparator comprises:
an n-channel metal oxide semiconductor (NMOS) output stage; and
a p-channel metal oxide semiconductor (PMOS) transconductance input stage configured to:
convert each of the voltage VM1 at the first node and the voltage VM2 at the second node into a current signal to obtain two current signals; and
send the two current signals to the NMOS output stage, and wherein the NMOS output stage is configured to:
convert each of the two received current signals into a voltage signal to obtain two voltage signals;
compare the first voltage threshold with the value of the differential mode voltage between the two voltage signals;
generate the first level signal as the first output signal when the value of the differential mode voltage between the two voltage signals is greater than the first voltage threshold; and
generate the second level signal as the first output signal when the value of the differential mode voltage between the two voltage signals is not greater than the first voltage threshold.

9. The phase-locked loop circuit according to claim 6, wherein the second comparator comprises:
a p-channel metal oxide semiconductor (PMOS) output stage; and
an n-channel metal oxide semiconductor (NMOS) transconductance input stage configured to:
convert each of the voltage VM1 at the first node and the voltage VM2 at the second node into a current signal to obtain two current signals; and
send the two current signals obtained after the conversion to a p-channel metal oxide semiconductor (PMOS) output stage, and wherein the PMOS output stage is configured to:
convert each of the two received current signals into a voltage signal to obtain two voltage signals;
compare the first voltage threshold with the value of the differential mode voltage between the two voltage signals;
generate the first level signal as the second output signal when the value of the differential mode voltage between the two voltage signals is greater than the first voltage threshold; and
generate the second level signal as the second output signal when the value of the differential mode voltage between the two voltage signals is not greater than the first voltage threshold.

10. The phase-locked loop circuit according to claim 1, wherein the mode controller is further configured to control the S1 to connect, the S2 to disconnect, and the S3 to connect in the loop low-pass filter when the bandwidth of the phase-locked loop circuit is not less than the bandwidth threshold.

11. The phase-locked loop circuit according to claim 1, wherein the first voltage-current converter comprises a first metal oxide semiconductor (MOS) transistor, wherein the second voltage-current converter comprises a second MOS transistor, wherein the second MOS transistor is smaller than the first MOS transistor in size, wherein a gate of the second MOS transistor receives an input voltage (VC1), wherein a source of the second MOS transistor is connected to the current-controlled oscillator, wherein a drain of the second MOS transistor is connected to a power supply voltage, wherein a gate of the first MOS transistor receives an input voltage (VC2), wherein a source of the first MOS transistor is connected to the current-controlled oscillator, and wherein a drain of the first MOS transistor is connected to the power supply voltage.

12. The phase-locked loop circuit according to claim 1, further comprising a transconductance-element low-pass filter configured to filter high-frequency noise in a power supply voltage, wherein the first voltage-current converter comprises:
a first metal oxide semiconductor (MOS) transistor; and
a third MOS transistor,
wherein the second voltage-current converter comprises:
a second MOS transistor; and
a fourth MOS transistor,
wherein the second MOS transistor is smaller than the first MOS transistor in size,
wherein the fourth MOS transistor is smaller than the third MOS transistor in size,
wherein a gate of the second MOS transistor receives an input voltage (VC1),
wherein a source of the second MOS transistor is connected to the current-controlled oscillator,
wherein a drain of the second MOS transistor is connected to a source of the fourth MOS transistor,
wherein a gate of the fourth MOS transistor is connected to the transconductance-element low-pass filter,
wherein the source of the fourth MOS transistor is connected to the drain of the second MOS transistor,
wherein a drain of the fourth MOS transistor is connected to the power supply voltage,
wherein a gate of the first MOS transistor receives an input voltage (VC2),
wherein a source of the first MOS transistor is connected to the current-controlled oscillator,
wherein a drain of the first MOS transistor is connected to a source of the third MOS transistor,
wherein a gate of the third MOS transistor is connected to the transconductance-element low-pass filter,
wherein the source of the third MOS transistor is connected to the drain of the first MOS transistor, and
wherein a drain of the third MOS transistor is connected to the power supply voltage.

13. The phase-locked loop circuit according to claim 12, wherein the transconductance-element low-pass filter comprises a resistor (Rs1) and a capacitor (Cs1), wherein a first end of the Rs1 is connected to the power supply voltage, and wherein a second end of the Rs1 is connected to the Cs1.

14. The phase-locked loop circuit according to claim 1, wherein a time constant of a circuit that comprises the R1 and the C1 in the first filter is greater than a time constant of a circuit that comprises the R2 and the C2 in the second filter.

15. A data recovery circuit, comprising:
a first voltage-current converter;
a second voltage-current converter;
a current-controlled oscillator;
a frequency divider;
a phase-locked loop circuit;
a frequency detector;
a phase detector; and
a data selector,
wherein the phase-locked loop circuit comprises:
a phase frequency detector configured to:
receive a reference source signal and a feedback signal that is output by the frequency divider; and
generate a first error signal;
a charge pump coupled to the phase frequency detector and configured to generate a first voltage signal according to the first error signal that is output by the phase frequency detector;
a loop low-pass filter, comprising a first filter, a second filter, a third node, a fourth node, a switch (S1), a switch (S2), and a switch (S3), wherein the first filter is configured to filter out a high frequency component in the first voltage signal that is output by the charge pump and generate a first control voltage signal (VC1) to provide for the second voltage-current converter, wherein the second filter is configured to filter out the high frequency component in the first voltage signal that is output by the charge pump and generate a second control voltage signal (VC2) to provide for the first voltage-current converter, wherein the first filter comprises a first resistor (R1) and a first capacitor (C1), wherein the R1 and the C1 are connected in series, wherein the second filter comprises a second resistor (R2) and a second capacitor (C2), wherein the R2 and the C2 are connected in series, wherein the third node is a node for taking out the first control voltage signal (VC1), wherein the fourth node is another node for taking out the second control voltage signal (VC2), wherein a first end of the S1 is coupled to a first node between the R1 and the C1, wherein a second end of the S1 is coupled to a second node between the R2 and the C2, wherein two ends of the S2 are respectively coupled to the first node and the fourth node, and wherein two ends of the S3 are respectively coupled to the third node and the fourth node; and
a mode controller coupled to the loop low-pass filter and configured to control the S1 to alternatively connect and disconnect, the S2 to connect, and the S3 to disconnect in
the loop low-pass filter when a bandwidth of the phase-locked loop circuit is less than a bandwidth threshold,
wherein the first voltage-current converter is coupled to the loop low-pass filter and configured to:
convert the received second control voltage signal VC2 into a current signal; and
input the current signal to the current-controlled oscillator;
wherein the second voltage-current converter is coupled to the loop low-pass filter and configured to:
convert the received first control voltage signal VC1 into another current signal; and
input the other current signal to the current-controlled oscillator,
wherein the current-controlled oscillator is configured to generate, according to received current signals, a phase-locked loop output signal whose frequency is a target frequency,
wherein one end of the frequency divider is coupled to the current-controlled oscillator and the other end is coupled to the phase frequency detector,
wherein the frequency divider is configured to:
perform frequency division on the frequency of the phase-locked loop output signal that is output by the current-controlled oscillator;
set a signal that is obtained after the frequency division as a frequency division feedback signal; and
send the frequency division feedback signal to the phase frequency detector, wherein the frequency detector is coupled to the data selector and configured to:
detect whether frequencies of the reference source signal and the feedback signal in the phase-locked loop circuit are consistent;
output a first control instruction to the data selector when the frequencies are inconsistent; and
output a second control instruction to the data selector when the frequencies are consistent,
wherein the data selector is coupled to the phase detector, the frequency detector, the phase frequency detector, and the charge pump and configured to:
select to connect the phase frequency detector and the charge pump according to the first control instruction that is output by the frequency detector; or
select to connect the phase detector and the charge pump according to the second control instruction that is output by the frequency detector,
wherein the phase detector is coupled to the data selector and the current-controlled oscillator and configured to:
compare a received link data signal with a first feedback signal that is output by the current-controlled oscillator when the phase-locked loop circuit is locked;
generate a second error signal; and
recover a data signal in the link data signal according to a second feedback signal that is output by the current-controlled oscillator when the link data signal is locked by the current-controlled oscillator, and
wherein the second error signal comprises a phase error between the link data signal and the first feedback signal.

16. A control method for a phase-locked loop circuit, comprising:
generating a first control voltage signal VC1 to provide for a second voltage-current converter in the phase-locked loop circuit;
generating a second control voltage signal VC2 to provide for a first voltage-current converter in the phase-locked loop circuit; and
controlling a S1 to alternatively connect and disconnect, a S2 to connect, and a S3 to disconnect in a loop low-pass filter in the phase-locked loop circuit when a bandwidth of the phase-locked loop circuit is less than a bandwidth threshold,
wherein the loop low-pass filter comprises a first filter, a second filter, a third node, a fourth node, the S1, the S2, and the S3,
wherein the first filter comprises a first resistor (R1) and a first capacitor (C1), wherein the R1 and the C1 are connected in series,
wherein the second filter comprises a second resistor (R2) and a second capacitor (C2),
wherein the R2 and the C2 are connected in series,
wherein the third node is a node for taking out the VC1,
wherein the fourth node is another node for taking out the VC2,
wherein a first end of the S1 is coupled to a first node between the R1 and the C1,
wherein a second end of the S1 is coupled to a second node between the R2 and the C2,
wherein two ends of the S2 are respectively coupled to the first node and the fourth node, and
wherein two ends of the S3 are respectively coupled to the third node and the fourth node.

17. The control method according to claim 16, wherein controlling the S1 to alternatively connect and disconnect comprises:
   comparing a first voltage threshold with a value of a differential mode voltage between a voltage VM1 at the first node and a voltage VM2 at the second node;
   controlling the S1 to connect when the value of the differential mode voltage between the VM1 and the VM2 is greater than the first voltage threshold; and
   controlling the S1 to disconnect when the value of the differential mode voltage between the VM1 and the VM2 is not greater than the first voltage threshold.

18. The control method according to claim 16, further comprising controlling the S1 to connect, the S2 to disconnect, and the S3 to connect in the loop low-pass filter when the bandwidth of the phase-locked loop circuit is not less than the bandwidth threshold.

* * * * *